United States Patent
Hirosaki

(10) Patent No.: US 7,470,378 B2
(45) Date of Patent: Dec. 30, 2008

(54) OXYNITRIDE FLUORESCENT MATERIAL AND LIGHT-EMITTING DEVICE

(75) Inventor: Naoto Hirosaki, Tsukuba (JP)

(73) Assignee: National Institute For Materials Science, Tsukuba-shi, Ibaraki (JP)

( * ) Notice: Subject to any disclaimer, the term of this patent is extended or adjusted under 35 U.S.C. 154(b) by 384 days.

(21) Appl. No.: 10/564,359

(22) PCT Filed: Sep. 30, 2004

(86) PCT No.: PCT/JP2004/014765

§ 371 (c)(1),
(2), (4) Date: Jan. 12, 2006

(87) PCT Pub. No.: WO2005/033247

PCT Pub. Date: Apr. 14, 2005

(65) Prior Publication Data
US 2006/0192178 A1  Aug. 31, 2006

(30) Foreign Application Priority Data
Oct. 3, 2003  (JP) ............................ 2003-346013

(51) Int. Cl.
C09K 11/79 (2006.01)
H01J 1/63 (2006.01)
(52) U.S. Cl. ............... 252/301.4 F; 257/98; 313/503; 313/467; 313/486; 313/582; 313/584
(58) Field of Classification Search ........... 252/301.4 F; 257/98; 313/503, 467, 486, 582, 584
See application file for complete search history.

(56) References Cited

U.S. PATENT DOCUMENTS

2003/0052595 A1  3/2003  Ellens et al.

2006/0049414 A1*  3/2006  Chandran et al. ............. 257/89

FOREIGN PATENT DOCUMENTS

| EP | 206393 A1 | 12/1986 |
| EP | 1278250 A2 | 1/2003 |
| EP | 1296376 A2 | 3/2003 |
| EP | 1445295 A1 | 8/2004 |

(Continued)

OTHER PUBLICATIONS

J. van Krevel, "On new rare-earth doped M-Si-Al-O-N materials", Chapater 6, pp. 73-87, 2000.*

(Continued)

*Primary Examiner*—C. Melissa Koslow
(74) *Attorney, Agent, or Firm*—Manabu Kanesaka

(57) ABSTRACT

Sialon fluorescent materials with activated Eu or other rare earth ions have been known as fluorescent materials capable of being excited by blue light to emit yellow light. An oxynitride fluorescent material can emit light having a far wider range of wavelengths than ever before, and can be included in a light-emitting device. A fluorescent material contains as a main component a crystal phase having a general formula $La_3Si_8N_{11}O_4$ or $La_3Si_{8-x}Al_xN_{11-x}O_{4+x}$ where $0<x\leq4$, to which an optically active element (M) including one or more elements selected from Mn, Ce, Pr, Nd, Sm, Eu, Gd, Tb, Dy, Ho, Er, Tm, Yb and Lu is added and contained as a luminescence center component.

20 Claims, 4 Drawing Sheets

FOREIGN PATENT DOCUMENTS

| | | |
|---|---|---|
| JP | 2002-363554 | 12/2002 |
| JP | 2004-67837 A | 3/2004 |
| JP | 2004-186278 A | 7/2004 |
| JP | 2004-277663 A | 10/2004 |
| JP | 2004-300247 A | 10/2004 |

OTHER PUBLICATIONS

Journal of Materials Science 17 (1982)2359-2364; Phase Relationships in the System $Si_3N_4$-$SiO_2$-$La_2O_3$, , pp. 2359-2364.

Chem., Mater, 1992 4, 260-267, Reviews, Nitrogen-15 and Oxygen-17 NMR Spectroscopy of Silicates and Nitrogen Ceramics, 1992 American Chemical Society.

"The structures of the Ce and La n-Phases $RE_3Si_{8-X}Al_XO_{4-X}$ ($X\approx1.75$ for RE=Ce, $X\approx1.5$ for RE=La), determined by single-crystal X-ray and time-of-flight neutron powder diffraction, respectively" pp. 2358-2362, The Royal Society of Chemistry 2001.

\* cited by examiner

OXYNITRIDE FLUORESCENT MATERIAL AND LIGHT-EMITTING DEVICE

ART FIELD

The present invention relates generally to a silicon oxynitride fluorescent material composed primarily of a crystal phase represented by general formula $La_3Si_8N_{11}O_4$ or $La_3Si_{8-x}Al_xN_{11-x}O_{4+x}$ where $0<x\leqq4$.

BACKGROUND ART

Fluorescent materials are used for vacuum fluorescent display tubes (VFDS), field emission displays (FEDs), plasma display panels (PDPs), cathode-ray tubes (CRTs), white light-emitting diodes (LEDs), etc. To allow the fluorescent material to emit light in any application, energy for exciting it must be supplied to it. Upon excitation by an excitation source having high energy such as vacuum ultraviolet radiation, ultraviolet radiation, electron radiation, blue light or the like, the fluorescent material gives out visible light rays. A problem with the fluorescent material is, therefore, that its luminance drops as a result of exposure to such an excitation source as mentioned above. To overcome that problem, sialon fluorescent materials have been proposed as those having more limited luminance decreases than do prior art fluorescent materials based on silicates, phosphates, aluminates, and sulfides.

The sialon fluorescent material, for instance, has been prepared by mixing together silicon nitride ($Si_3N_4$), aluminum nitride (AlN) and europium oxide ($Eu_2O_3$) at a given molar ratio, and then subjecting the resulting mixture to hot-press firing wherein it is held at a temperature of 1,700° C. for 1 hour in nitrogen of 1 atm (0.1 MPa) (for instance, see patent publication 1). α-sialon with activated Eu ions, obtained by this method, has been reported to provide a fluorescent material that is excited by blue light of 450 to 500 nm, giving out yellow light of 550 to 600 nm. For applications such as white LEDs or plasma displays using an ultraviolet LED as an excitation source, however, fluorescent materials emitting not only yellow light but also blue light of 420 nm to 470 nm or green light of 500 nm to 550 nm are also still in need Patent Publication 1: JP(A)2002-363554

SUMMARY OF THE INVENTION

Subject Matter of the Invention

The primary object of the invention is to provide an oxynitride fluorescent material capable of emitting light having a far wider range of wavelengths than could be achievable with conventional rare earth-activated sialon fluorescent materials.

How the Subject Matter is Achieved

Such being the case, we have made study after study about fluorescent materials that contain an optically active element M and elements La, Si, Al, N and O, where M is one or two or more elements selected from Mn, Ce, Pr, Nd, Sm, Eu, Gd, Tb, Dy, Ho, Er, Tm, Yb and Lu, and consequently found out that a material having a specific composition domain range and a specific crystal phase can provide a fluorescent material that emits blue light of about 450 nm and green light of about 540 nm. That is, we have found out that a crystal comprising a $La_3Si_8N_{11}O_4$ or $La_3Si_{8-x}Al_xN_{11-x}O_{4+x}$ where $0<x\leqq4$ with M (one or two or more elements selected from Mn, Ce, Pr, Nd, Sm, Eu, Gd, Tb, Dy, Ho, Er, Tm, Yb and Lu) added thereto as a luminescence center can provide a florescent material capable of emitting blue or green light.

The $La_3Si_8N_{11}O_4$ crystal phase, occurring by high-temperature firing of a composition approximate to $La_2O_3$-$2Si_3N_4$, has been synthesized by M. Mitomo et al. and indexed by X-ray diffraction, and before the filing of this application, its details have already been reported in academic literature (see non-patent publication 1).

After that, R. K. Harris et al. identified the exact composition of that crystal to be $La_3Si_8N_{11}O_4$ and reported its details in academic literature (non-patent publication 2)

The $La_3Si_{8-x}Al_xN_{11-x}O_{4+x}$ crystal phase is a solid solution made up of a $La_3Si_8N_{11}O_4$ crystal containing Al and O. Details of that crystal phase, synthesized and structurally analyzed by Jekabs Grins et al., were reported in academic literature (see non-patent publication 3), too, before filing of this application.

Non-Patent Publication 1

M. Mitomo and three others, "Journal of Materials Science", 1982, Vol. 17, pp. 2359-2364

Non-Patent Publication 2

R. K. Harris and two others, "Chemical Materials", 1992, Vol. 4, pp. 260-267

Non-Patent Publication 3

Jekabs Grins and three others, "Journal of Materials Chemistry", 2001, Vol. 11, pp. 2358-2362

In any case, as far as the process of research of the sintering of silicon nitride has gone, the $La_3Si_8N_{11}O_4$ or $La_3Si_{8-x}Al_xN_{11-x}O_{4+x}$ crystal phase per se has been exclusively studied for their heat resistance; never until now is there any study about using them as a fluorescent material. That the $La_3Si_8N_{11}O_4$ or $La_3Si_{8-x}Al_xN_{11-x}O_{4+x}$ crystal phase can be used as a fluorescent material that is excited by ultraviolet radiation, visible light, and electron radiation, giving out red light with high luminance, has been discovered by us for the first time.

We have extended this finding to further research, resulting in a discovery of a unique light emission phenomenon having improved luminance properties in a specific wavelength range, as embodied in (1) to (13) below.

Having been made as a result of a series of researches on the basis of the aforesaid findings, the present invention successfully provides an oxynitride fluorescent material capable of emitting light with ever higher luminance, and a lighting device using the same.

(1) An oxynitride fluorescent material, characterized by containing as a main component a crystal phase represented by a general formula $La_3Si_8N_{11}O_4$, with an optically active element (M) added thereto as a luminescence center.

(2) The oxynitride fluorescent material according to (1) above, characterized in that said optically active element (M) comprises one or two or more elements selected from Mn, Ce, Pr, Nd, Sm, Eu, Gd, Tb, Dy, Ho, Er, Tm, Yb and Lu.

(3) An oxynitride fluorescent material, characterized by containing as a main component a crystal phase represented by a general formula $La_3Si_{8-x}Al_xN_{11-x}O_{4+x}$, where $0<x\leqq4$, with an optically active element (M) added thereto as a luminescence center.

(4) The oxynitride fluorescent material according to (3) above, characterized in that said optically active element (M) comprises one or two or more elements selected from Mn, Ce, Pr, Nd, Sm, Eu, Gd, Tb, Dy, Ho, Er, Tm, Yb and Lu.

(5) The oxynitride fluorescent material according to (4) above, characterized in that x is $0<x\leqq2$.

(6) The oxynitride fluorescent material according to any one of (1) to (5) above, characterized in that at least Ce is contained as said optically active element (M).

(7) The oxynitride fluorescent material according to any one of (1) to (6) above, characterized in that at least Tb is contained.

(8) An oxynitride fluorescent material, characterized by comprising an optically active element (M) and elements La, Si, Al, N and O, where M is one or two or more elements selected from Mn, Ce, Pr, Nd, Sm, Eu, Gd, Tb, Dy, Ho, Er, Tm, Yb and Lu, having a compositional formula $M_aLa_bSi_cAl_dN_eO_f$ provided that a+b=3, and satisfying all conditions (i), (ii), (iii), (iv) and (v):

$$0.00001 \leqq a \leqq 2.5 \quad (i)$$

$$4 \leqq c \leqq 10 \quad (ii)$$

$$0 \leqq d \leqq 4 \quad (iii)$$

$$7 \leqq e \leqq 14 \quad (iv)$$

$$2 \leqq f \leqq 8 \quad (v)$$

(9) The oxynitride fluorescent material according to (8) above, characterized in that d=0.

(10) The oxynitride fluorescent material according to (8) or (9) above, characterized in that the values of c, e and f are c=8, e=11 and f=4, respectively.

(11) The oxynitride fluorescent material according to any one of (8) to (10) above, characterized in that Ce is selected as an M component.

(12) The oxynitride fluorescent material according to any one of (8) to (10) above, characterized in that Tb is selected as said optically active element (M).

(13) The oxynitride fluorescent material according to any one of (1) to (12) above, characterized by comprising a mixture of a $La_3Si_8N_{11}O_4$ or $La_3Si_{8-x}Al_xN_{11-x}O_{4+x}$ crystal phase where $0<x\leqq4$ with other crystal phase or an amorphous phase, and having a $La_3Si_8N_{11}O_4$ or $La_3Si_{8-x}Al_xN_{11-x}O_{4+x}$ crystal phase content of at least 50% by mass.

(14) A lighting device comprising a light emission source and a fluorescent material, characterized by use of at least a fluorescent material as recited in any one of (1) to (13) above.

(15) The lighting device according to (14) above, characterized in that said light emission source is an LED emitting a 330 to 420-nm wavelength light.

(16) The lighting device according to (14) or (15), characterized in that said light emission source is a 330 to 420-nm wavelength light emitting LED that is used in combination with a fluorescent material as recited in any one of (1) to (13) above, a green luminescent material that emits light having a wavelength of 520 nm to 570 nm inclusive in response to excitation light of 330 to 420 nm and a red fluorescent material that emits light of 570 nm to 700 nm inclusive in response to excitation light of 330 to 420 nm to mix together red light, green light and blue light, thereby emitting white light.

(17) The lighting device according to (14) or (15), characterized in that said light emission source is a 330 to 420-nm wavelength light emitting LED that is used in combination with a fluorescent material as recited in any one of (1) to (13) above and a yellow fluorescent material that emits light having a wavelength of 550 nm to 600 nm inclusive in response to excitation light of 330 to 420 nm to mix together yellow light and blue light, thereby emitting white light.

(18) The lighting device according to (16) above, characterized in that said green fluorescent material is β-sialon with Eu in a solid solution form.

(19) The lighting device according to (16) above, characterized in that said red fluorescent material is $CaAlSiN_3$ with Eu in a solid solution form.

(20) The lighting device according to (17) above, characterized in that said yellow fluorescent material is Ca-α-sialon with Eu in a solid solution-form.

(21) An image display device comprising an excitation source and a fluorescent material, characterized by use of at least a fluorescent material as recited in any one of (1) to (13) above.

(22) The image display device according to (21) above, characterized by being any one of a vacuum fluorescent display tube (VFD), a field emission panel (FED), a plasma display panel (PDP), and a cathode ray tube (CRT).

ADVANTAGES OF THE INVENTION

The oxynitride fluorescent material provided by the invention with the aforesaid unique structure is comprised of the basic or matrix crystal and the optically active element M. Only with the basic crystal (called the matrix crystal) free of M, however, there is no light emission. In other words, with either a structure wherein a part of components of the basic crystal phase represented by $La_3Si_8N_{11}O_4$ or $La_3Si_{8-x}Al_xN_{11-x}O_{4+x}$ where $0<x\leqq4$ is substituted by the optically active element (M) in a solid solution form or a solid solution structure wherein the optically active element (M) penetrates through the crystal space of that crystal phase, fluorescent emission capabilities come out. The basic crystal (matrix crystal) (i) absorbs excitation light to transmit energy to M, and (ii) changes an electron state around M to have influences on emission colors or emission intensities. The fluorescent material allows both (i) and (ii) to cooperate to emit light, and the light emission properties are determined and governed by how the matrix crystal combines with the activation element. The fluorescent material has advantages over the prior art sialon fluorescent materials in that higher luminance is obtainable, and upon exposure to excitation sources, the material is lesser susceptible to deteriorate and luminance drops are much more reduced, and so it is well fit for VFDs, FEDs, PDPs, CRTs, white LEDs, etc. Thus, the fluorescent material of the invention provides a novel, useful material for material designs in such fields, and so it would be of great significance and make a lot of contribution to developments of the industry.

EXPLANATION OF THE REFERENCE NUMERALS

Figure 1:
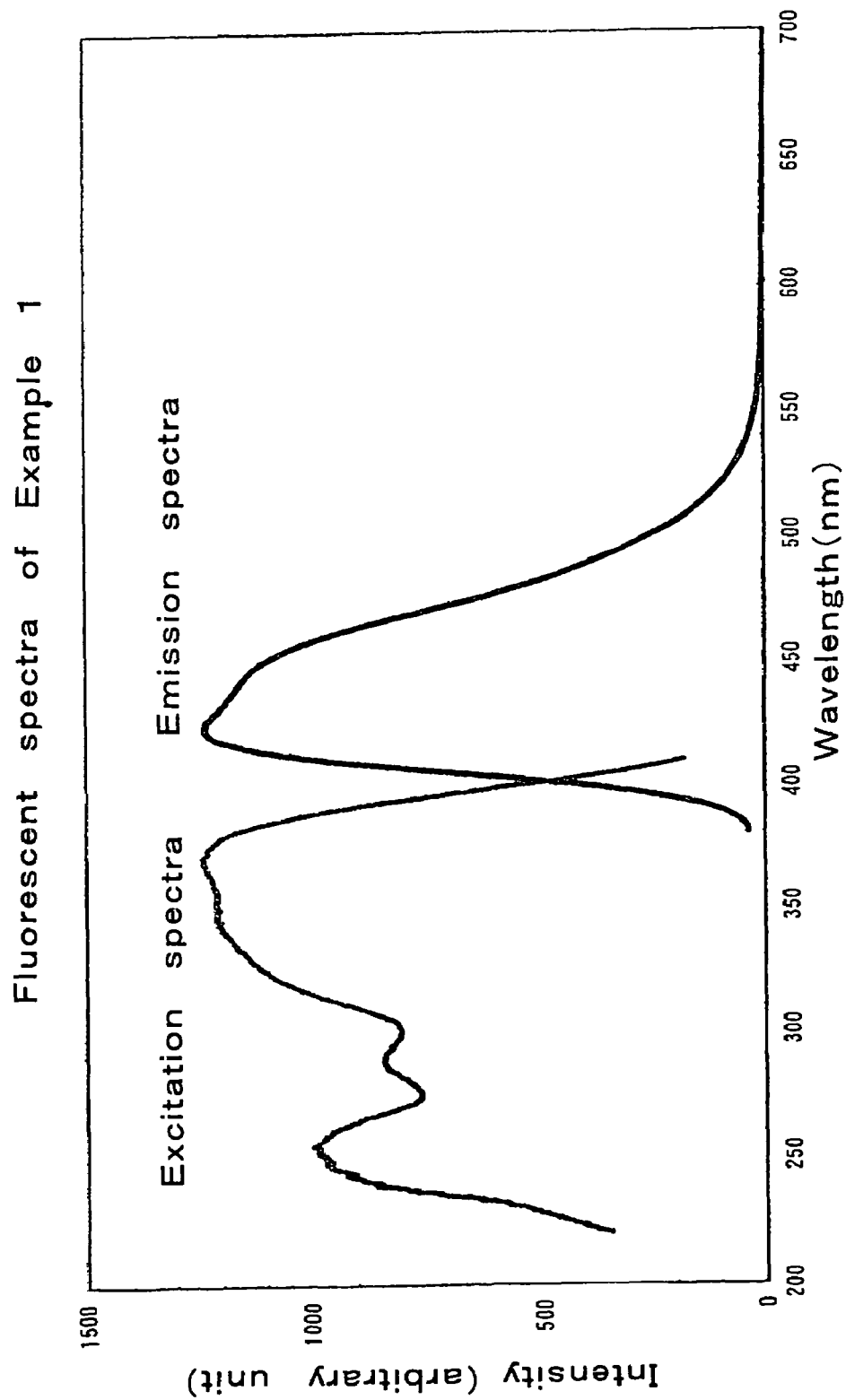
FIG. 1 is a spectral diagram for excitation and emission spectra of one embodiment of the inventive oxy-nitride (Example 1).
Figure 2:
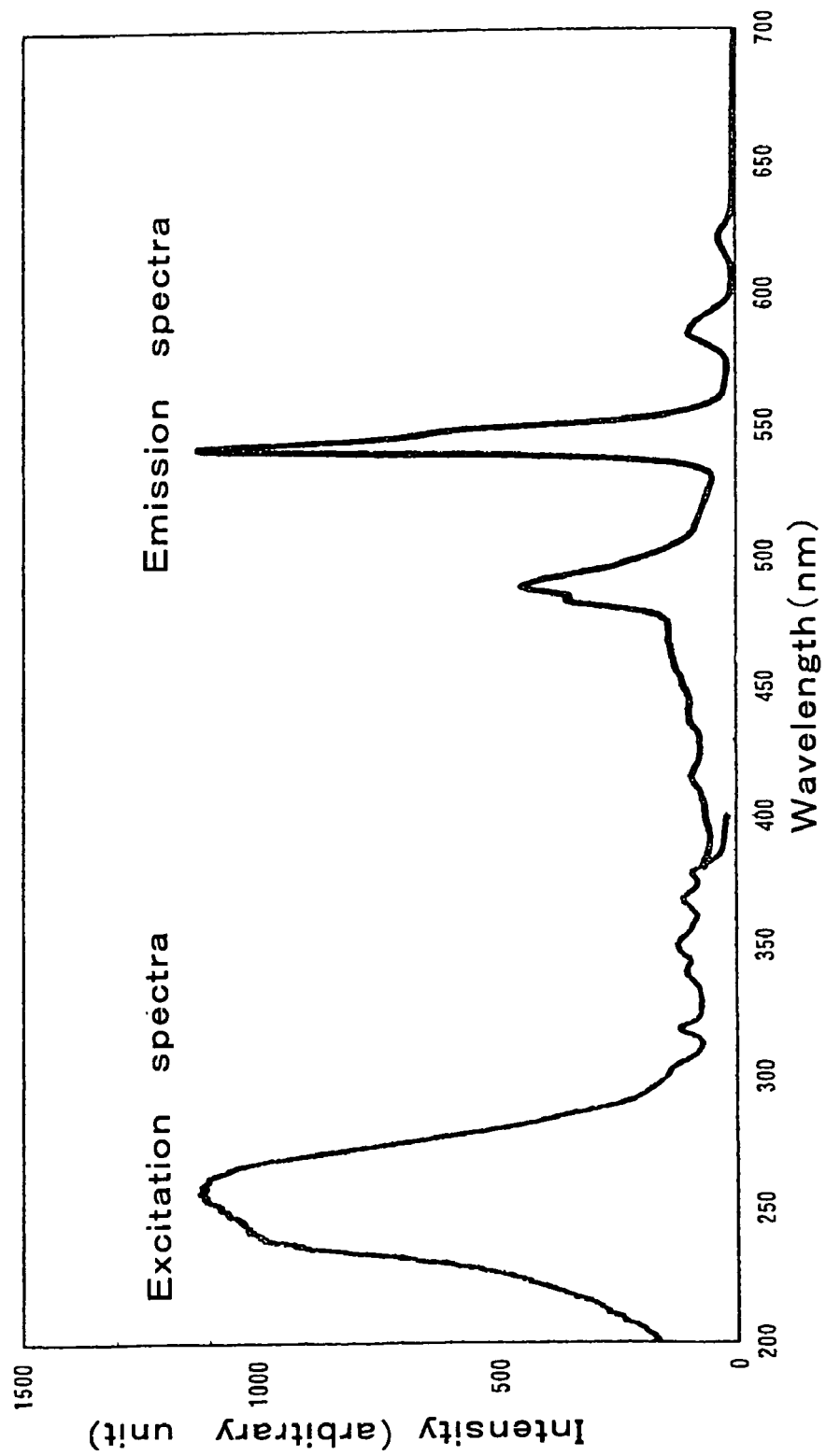
FIG. 2 is a spectral diagram for excitation and emission spectra of another embodiment of the inventive oxynitride (Example 2).

1: Mixture of the inventive red fluorescent material (Ex. 1) with a yellow fluorescent material or a blue fluorescent material plus a green fluorescent material,
2: LED chip,
3, 4: Electrically conductive terminals,
5: Wire bond,
6: Resin layer,
7: Vessel,
8: Inventive blue fluorescent material (Ex. 1),
9: Green fluorescent material,
10: Red fluorescent material,
11, 12, 13: Ultraviolet emitting cells,
14, 15, 16, 17: Electrodes,
18, 19: Dielectric layers,
20: Protective layer, and
21, 22: Glass substrates.

BEST MODE FOR CARRYING OUT THE INVENTION

The fluorescent material of the invention comprises as its main component a crystal phase having the general formula $La_3Si_8N_{11}O_4$ or $La_3Si_{8-x}Al_xN_{11-x}O_{4+x}$ where $0<x\leq4$, or a solid solution thereof. In consideration of fluorescence emission, it is here desired that $La_3Si_8N_{11}O_4$ or $La_3Si_{8-x}Al_xN_{11-x}O_{4+x}$ that is the main constituent of the oxynitride fluorescent material be contained as much as possible with high purity, and whenever possible, in a single phase form. Unless there is property degradation, however, they could be used in admixture with other crystal phase or an amorphous phase.

Preferably for high luminance, the content of the $La_3Si_8N_{11}O_4$ or $La_3Si_{8-x}Al_xN_{11-x}O_{4+x}$ phase should be at least 50% by mass. The term "main component" used herein is understood to mean that the content of the $La_3Si_8N_{11}O_4$ or $La_3Si_{8-x}Al_xN_{11-x}O_{4+x}$ phase is at least 50% by mass. Alternatively, a solid solution having the same crystal structure as the $La_3Si_8N_{11}O_4$ crystal could be used as the main component. In that solid solution, a part of La is substituted by metals such as Mn, Ce, Pr, Nd, Sm, Eu, Gd, Tb, Dy, Ho, Er, Tm, Yb, and Lu; a part of Si is substituted by Al or the like; and a part of N is substituted by oxygen. In the $La_3Si_{8-x}Al_xN_{11-x}O_{4+x}$ phase, a part of Si is substituted by Al, and a part of N is substituted by O. The range of $0<x\leq4$ wherein x is a parameter indicative of the amount of solid solution ensures that a stable $La_3Si_{8-x}Al_xN_{11-x}O_{4+x}$ phase occurs. In particular, the range of $0<x\leq2$ ensures that a florescent material having ever higher luminance is obtainable. In addition, simultaneous substitution by two or more elements could be included in the invention.

With incorporation in a solid solution form of the element M (one or two or more selected from Mn, Ce, Pr, Nd, Sm, Eu, Gd, Tb, Dy, Ho, Er, Tm, Yb, and Lu) in the matrix of the $La_3Si_8N_{11}O_4$ or $La_3Si_{8-x}Al_xN_{11-x}O_{4+x}$ matrix crystal phase, these elements work as luminescence centers, and have fluorescence emission capabilities. Of the elements M, Ce excels in blue light emission capability and Tb excels in green light emission capability.

In the invention, given the crystal or solid solution of the $La_3Si_8N_{11}O_4$ or $La_3Si_{8-x}Al_xN_{11-x}O_{4+x}$ phase, no critical limitation is imposed on the type of composition. With such compositions as specified below, however, a fluorescent material having ever higher luminance is obtainable because of an increased content of the $La_3Si_8N_{11}O_4$ or $La_3Si_{8-x}Al_xN_{11-x}O_{4+x}$ phase.

Specific compositions of the invention contain the elements M, La, Si, Al, N and O where M is one or two or more selected from Mn, Ce, Pr, Nd, Sm, Eu, Gd, Tb, Dy, Ho, Er, Tm, Yb, and Lu, and have a compositional formula $M_aLa_bSi_cAl_dN_eO_f$ on condition that a+b=3. The compositional formula stands for the ratio of the number of atoms that constitutes a given substance, and a substance with a, b, c, d, e and f multiplied by any number has the same composition, too. Consequently, the following conditions are determined for a composition with a, b, c, d, e and f recalculated in such a way as to be a+b=3.

In the invention, the values of a, c, d, e and f are selected from the range of values that satisfy all conditions (i), (ii), (iii), (iv) and (v).

$$0.00001 \leq a \leq 2.5 \quad (i)$$

$$4 \leq c \leq 10 \quad (ii)$$

$$0 \leq d \leq 4 \quad (iii)$$

$$7 \leq e \leq 14 \quad (iv)$$

$$2 \leq f \leq 8 \quad (v)$$

Here, the small letter $\underline{a}$ stands for the amount of the element added as the luminescence center, and $\underline{c}$, $\underline{d}$, $\underline{e}$ and $\underline{f}$ represent deviations from the $La_3Si_8N_{11}O_4$ composition.

The small letter $\underline{a}$ stands for the amount of the element M added as the luminescence center, which should preferably be determined such that the value of $3\times M/(M+La)$ that is the ratio of the number of atoms between M and (M+La) in the fluorescent material is in the range of 0.00001 to 2.5 inclusive. As the value of $3\times M/(M+La)$ is smaller than 0.00001, there is an emission luminance drop because of fewer M's. As the value of $3\times M/(M+La)$ exceeds 2.5, there is again a luminance drop by reason of concentration quenching responsible ascribable to interferences between M ions.

The value of $\underline{c}$ is the content of Si, given by $4\leq c\leq10$. For the $La_3Si_8N_{11}O_4$ crystal, it is preferable that c=8, and for the $La_3Si_{8-x}Al_xN_{11-x}O_{4+x}$ crystal, it is preferable that c=8−d. As the value of $\underline{c}$ deviates from this range, there is an emission luminance drop because of no formation of any stable $La_3Si_8N_{11}O_4$ or $La_3Si_{8-x}Al_xN_{11-x}O_{4+x}$ crystal phase.

The value of $\underline{d}$ is the content of Al, given by $0\leq d\leq4$. For the $La_3Si_8N_{11}O_4$ crystal, it is preferable that d=0, and for the $La_3Si_{8-x}Al_xN_{11-x}O_{4+x}$ crystal, it is preferable that $0<d\leq2$. As the value of $\underline{d}$ deviates from this range, there is an emission luminance drop because of no formation of any stable $La_3Si_8N_{11}O_4$ or $La_3Si_{8-x}Al_xN_{11-x}O_{4+x}$ crystal phase.

The value of $\underline{e}$ is the content of N, given by $7\leq e\leq14$. For the $La_3Si_8N_{11}O_4$ crystal, it is preferable that e=11, and for the $La_3Si_{8-x}Al_xN_{11-x}O_{4+x}$ crystal, it is preferable that e=11−d. As the value of $\underline{e}$ deviates from this range, there is an emission luminance drop because of no formation of any stable $La_3Si_8N_{11}O_4$ or $La_3Si_{8-x}A_{11}N_{11-x}O_{4+x}$ crystal phase.

The value of $\underline{f}$ is the content of O, given by $2\leq f\leq8$. For the $La_3Si_8N_{11}O_4$ crystal, it is preferable that f=4, and for the $La_3Si_{8-x}Al_xN_{11-x}O_{4+x}$ crystal, it is preferable that f=4+d. As the value of $\underline{f}$ deviates from this range, there is an emission luminance drop because of no formation of any stable $La_3Si_8N_{11}O_4$ or $La_3Si_{8-x}Al_xN_{11-x}O_{4+x}$ crystal phase.

The fluorescent material of the invention differs in excitation spectra and fluorescent spectra with its composition, and if they are selectively combined, it will provide a variety of emission spectra. In other words, the spectra needed in a particular situation can be determined as desired. In particular, with a composition of the $La_3Si_8N_{11}O_4$ phase with Eu added thereto in such a way as to meet $0.00001 \leq 3 \times Ce/(Ce+La) \leq 2.5$, higher emission capability is obtainable in a blue range of about 450 nm, and with a composition of the $La_3Si_8N_{11}O_4$ phase with Tb added thereto in such a way as to meet $0.000011 \leq 3 \times Tb/(Tb+La) \leq 2.5$, higher emission capability is obtainable in a green range of about 540 nm.

The crystal phase used herein should preferably be made up of a single $La_3Si_8N_{11}O_4$ or $La_3Si_{8-x}Al_xN_{11-x}O_{4+x}$ phase; however, it could be used in admixture with other crystal phase or an amorphous phase in such a range as not to be detrimental to emission capability. Preferably for higher luminance, the content of the $La_3Si_8N_{11}O_4$ or $La_3Si_{8-x}Al_xN_{11-x}O_{4+x}$ phase should exceed 50% by mass. Thus, the term "main component" means that the content of the $La_3Si_8N_{11}O_4$ or $La_3Si_{8-x}Al_xN_{11-x}O_{4+x}$ phase is at least 50% by mass. The proportion of the $La_3Si_8N_{11}O_4$ or $La_3Si_{8-x}Al_xN_{11-x}O_{4+x}$ phase to be contained may be found from the ratio of the strongest peaks of the $La_3Si_8N_{11}O_4$ or $La_3Si_{8-x}Al_xN_{11-x}O_{4+x}$ phase and other crystal phase(s) as measured by X-ray diffractometry.

When the fluorescent material of the invention is used in situations where it is excited by electron radiation, the fluorescent material could be mixed with an electrically conductive inorganic material to give it electrical conductivity. The conductive inorganic material includes oxides, oxynitrides or nitrides containing one or two or more elements selected from Zn, Al, Ga, In and Sn, or their mixture.

The oxynitride fluorescent material obtained by the fabrication process of the invention is capable of emitting light at a wavelength higher than that at which prior art sialon or oxynitride fluorescent materials are used, and lesser susceptible of luminance degradation upon exposure to excitation sources, and so it lends itself well to VFDs, FEDs, PDPs, CRTs, white LEDs, etc.

The lighting device of the invention is built up of at least a light-emitting source and the fluorescent material of the invention. The lighting device, for instance, includes an LED lighting device and a fluorescent lamp. For instance, the LED lighting device may be fabricated using the fluorescent material of the invention according to such known methods as set forth in prior publications such as JP(A)'s 5-152609 and 7-99345 and Japanese Patent No. 2927279. Preferably in this case, the light-emitting source used should emit light having a wavelength of 100 nm to 500 nm, and particular preference is given to an ultraviolet (violet) LED light-emitting element having a wavelength of 330 nm to 420 nm.

Some light-emitting elements are formed of nitride semiconductors such as GaN and InGaN, and if their composition is controlled, they can provide a light-emitting source capable of emitting light at a given wavelength.

When the lighting device is built up, the fluorescent material of the invention could be used alone or in combination with a fluorescent material having other emission properties. In this manner, a lighting device capable of emitting light in the desired color could be set up. As an example, there is a combination of an ultraviolet or violet LED emission element having a wavelength of 330 nm to 420 nm, a green fluorescent material that is excited at this wavelength to give out light having a wavelength of 520 nm to 570 nm inclusive, a red fluorescent material capable of emitting light of 570 nm to 700 nm inclusive and the fluorescent material of the invention. Such green fluorescent materials include $BaMgAl_{10}O_{17}$:Eu, Mn or β-sialon and such red fluorescent materials include $Y_2O_3$:Eu, and $CaAlSiN_3$:Eu. Among others, β-sialon:Eu and $CaAlSiN_3$:Eu, because the matrix crystal is formed of a nitride or oxy-nitride, are similar to the fluorescent material of the invention in terms of crystallographic characteristics and, hence, dependencies of emission intensity on temperature changes. Thus, they are preferable for use in admixture form with the fluorescent material of the invention. As the fluorescent materials in this lighting device are irradiated with ultraviolet radiation coming out of the LED, it allows three light, red, green and blue to be mixed together into white light.

There is another combination of an ultraviolet or violet LED emission device of 330 nm to 420 nm, a yellow fluorescent material that is excited at this wavelength to have an emission peak at a wavelength of 550 nm to 600 nm inclusive and the fluorescent material of the invention. Such yellow fluorescent materials include $(Y, Gd)_2(Al, Ga)_5O_{12}$:Ce as set forth in Japanese Patent No. 2927279, and α-sialon:Eu as set forth in JP(A)2002-363554. Among others, Ca-α-sialon with Eu in a solid solution form is preferred because of its high emission luminance. As the fluorescent materials in this lighting device are irradiated with ultraviolet or violet light coming from the LED, it allows blue light and yellow light to be mixed together into whitish or reddish light like one emitted out of an electric bulb.

Comprising at least an excitation source and the fluorescent material of the invention, the image display of the invention is embodied in the form of a vacuum fluorescent display tube (VFD), a field emission display (FED), a plasma display panel (PDP), a cathode-ray tube (CRT) or the like. The fluorescent material of the invention has already been found to emit light upon excitation with vacuum ultraviolet radiation of 100 nm to 190 nm, and ultraviolet or electron radiation of 190 nm to 380 nm. As described above, such an image display may be set up by a combination of these excitation sources with the fluorescent material of the invention.

Although the invention is now explained in further details with reference to specific examples, it is to be understood that they are given as an aid only to a better understanding of the invention, and the invention is never limited thereto.

EXAMPLE 1

The starting powders used were silicon nitride powders having an average particle diameter of 0.5 μm, an oxygen content of 0.93% by weight and α-type content of 92%, lanthanum oxide powders with a 99.9% purity and cerium oxide powders with a 99.9% purity.

The silicon nitride, lanthanum oxide and cerium oxide powders were weighed in the respective amounts of 46.01% by weight, 43.27% by weight and 10.72% by weight so as to obtain a compound having a compositional formula $Ce_{0.57}La_{2.43}Si_9N_{12}O_{4.5}$ (with mixture compositions of the starting powders shown in Table 1 and compositional parameters shown in Table 2). Then, the powders were mixed together with the addition of hexane in a ball mill for 2 hours, followed by drying in a rotary evaporator. The ensuring compound was molded in a mold with the application of a pressure of 20 MPa to obtain a compact of 12 mm in diameter and 5 mm in thickness.

That compact was placed in a boron nitride crucible, which was then set in an electric furnace of the graphite resistance-heating mode. Firing operation was started with evacuation of a firing atmosphere with a diffusion pump. Then, the compact was heated from room temperature up to 800° C. at a heating rate of 500° C. per hour, and at 800° C. nitrogen with a purity of 99.999% by volume was admitted into the furnace to bring the pressure to 1 MPa. Finally, the temperature was brought up to 1,750° C. at a rate of 500° C. per hour, and at 1,750° C. the compact was held for 4 hours. After firing, the constituting crystals of the obtained sintered compact were identified in following manner. As a result, they were judged as a $La_3Si_8N_{11}O_4$ phase. First, the synthesized sample was ground down to powders in an agate mortar for powder X-ray diffraction measurement using $K_\alpha$ radiation of Cu. The ensuing chart showed a pattern reported in FIG. 1 of non-patent publication 1, indicative of the $La_3Si_8N_{11}O_4$ phase. As a result of irradiation of the powder sample with 365-nm wavelength light coming from a lamp, it was found to emit blue light.

As a result of measuring the emission spectrum and the excitation spectrum of the powder sample using a fluorescent emission spectrometer, it was found to be a fluorescent material having an excitation spectrum peak at 371 nm and a peak at 424-nm blue light in an emission spectrum upon excitation by 371-nm ultraviolet light (FIG. 1). The peak emission intensity was 1,787 counts. It is here to be noted that the count value varies with a measuring device and conditions, so it is given in an arbitrary unit. In other words, comparison is possible among inventive examples alone or comparative examples alone measured under the same conditions.

Emission properties of the powder sample upon excitation by electron radiation were observed under an SEM equipped with a cathode luminescence (CL) detector. With this system, visible light generated by irradiation with electron radiation is guided through an optical fiber to a photomultiplier located outside it, so that the emission spectra of light emitted upon excitation by electron radiation can be measured. It was ascertained that the inventive fluorescent material was excited by electron radiation to emit blue light of 430 nm in wavelength.

EXAMPLES 2-10

The starting powders used herein were the same silicon nitride powders, lanthanum oxide powders and cerium nitride powders as in Example 1 as well as europium oxide powders with a 99.9% purity, terbium oxide powders with a 99.9% purity, aluminum oxide powders with a 99.9% purity and lanthanum oxide powders with a 99.9% purity. Oxynitride powders were prepared following Example 1 with the exception that the compositions set out in Tables 1 and 2 were used. As a consequence of X-ray diffractometry upon pulverization of the synthesized samples, the compositions in Examples 2 to 8 were all identified as the $La_3Si_8N_{11}O_4$ phase, and the compositions in Examples 9 and 10 were all identified as the $La_3Si_{8-x}Al_xN_{11-x}O_{4+x}$ phase. Further, there were obtained fluorescent materials that were excited by ultraviolet radiation to give out visible light with high luminance, as shown in Examples 2 to 10 in Table 3. In particular, the samples with Ce added thereto provided excellent blue fluorescent materials and the sample with Tb added thereto provided excellent green fluorescent materials.

The results of Examples 1 to 10 are summarized in Tables 1, 2 and 3.

Table 1 are indicative of the mixture compositions of the starting powders in Examples 1 to 10; Table 2 is indicative of the parameters for the design compositions of the starting powders in Examples 1 to 10; and Table 3 is indicative of the wavelengths and intensities of the excitation and emission spectra in Examples 1 to 10.

TABLE 1

|         |    | $Si_3N_4$ | $La_2O_3$ | $CeO_2$ | $Eu_2O_3$ |
|---------|----|-----------|-----------|---------|-----------|
| Example | 1  | 46.01     | 43.27     | 10.72   | 0         |
|         | 2  | 45.59     | 42.87     | 0       | 0         |
|         | 3  | 45.9      | 43.16     | 0       | 10.94     |
|         | 4  | 46.26     | 53.17     | 0.57    | 0         |
|         | 5  | 46.13     | 48.21     | 5.66    | 0         |
|         | 6  | 45.58     | 26.46     | 27.96   | 0         |
|         | 7  | 45.18     | 10.49     | 44.33   | 0         |
|         | 8  | 43.28     | 40.2      | 10.62   | 0         |
|         | 9  | 37.81     | 45.15     | 11.93   | 0         |
|         | 10 | 37.42     | 44.69     | 0       | 0         |

|         |    | $Tb_4O_7$ | $Al_2O_3$ | AlN   | LaN |
|---------|----|-----------|-----------|-------|-----|
| Example | 1  | 0         | 0         | 0     | 0   |
|         | 2  | 11.54     | 0         | 0     | 0   |
|         | 3  | 0         | 0         | 0     | 0   |
|         | 4  | 0         | 0         | 0     | 0   |
|         | 5  | 0         | 0         | 0     | 0   |
|         | 6  | 0         | 0         | 0     | 0   |
|         | 7  | 0         | 0         | 0     | 0   |
|         | 8  | 0         | 0         | 0     | 0   |
|         | 9  | 0         | 1.96      | 3.16  | 0   |
|         | 10 | 0         | 1.94      | 3.12  | 0   |

TABLE 2

| | Parameters | | | | | |
|---|---|---|---|---|---|---|
| | a | b | c | d | e | f |
| Ex. 1  | 0.57  | 2.43  | 9 | 0 | 12 | 4.5 |
| Ex. 2  | 0.57  | 2.43  | 9 | 0 | 12 | 4.5 |
| Ex. 3  | 0.57  | 2.43  | 9 | 0 | 12 | 4.5 |
| Ex. 4  | 0.03  | 2.97  | 9 | 0 | 12 | 4.5 |
| Ex. 5  | 0.3   | 2.7   | 9 | 0 | 12 | 4.5 |
| Ex. 6  | 1.5   | 1.5   | 9 | 0 | 12 | 4.5 |
| Ex. 7  | 2.4   | 0.6   | 9 | 0 | 12 | 4.5 |
| Ex. 8  | 0.533 | 2.467 | 8 | 0 | 11 | 4   |
| Ex. 9  | 0.6   | 2.4   | 7 | 1 | 10 | 5   |
| Ex. 10 | 0.6   | 2.4   | 7 | 1 | 10 | 5   |

TABLE 3

| | Light Emission | | | |
|---|---|---|---|---|
| | Wavelength nm | Intensity AU* | Wavelength nm | Intensity AU* |
| Ex. 1  | 424 | 1239 | 371 | 1242 |
| Ex. 2  | 542 | 1124 | 256 | 1122 |
| Ex. 3  | 501 | 32   | 428 | 33   |
| Ex. 4  | 425 | 809  | 370 | 790  |
| Ex. 5  | 431 | 1421 | 372 | 1415 |
| Ex. 6  | 433 | 1720 | 372 | 1733 |
| Ex. 7  | 435 | 1056 | 374 | 1049 |
| Ex. 8  | 436 | 2013 | 372 | 2002 |
| Ex. 9  | 430 | 1884 | 365 | 1887 |
| Ex. 10 | 545 | 1911 | 258 | 1881 |

AU*: Arbitrary Unit

Figure 3:
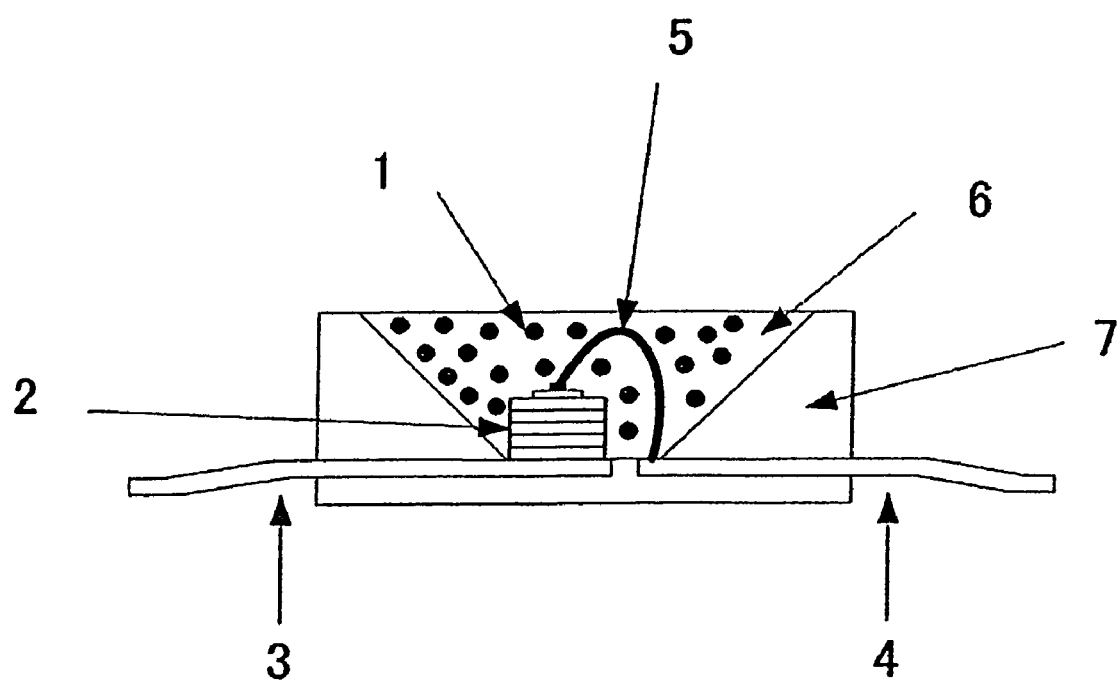
FIG. 3 is illustrative in schematic of one embodiment of the inventive lighting device (LED lighting device).

The lighting device using the fluorescent material comprising the nitride according to the invention is now explained. FIG. 3 is illustrative in schematic of the structure of a white LED working as a lighting device. A 405-nm violet LED 2 is used as a light-emitting element. The fluoreoscent material of inventive Example 1 and a Ca-α-sialon:Eu yellow fluorescent material composed of $Ca_{0.75}Eu_{0.25}Si_{8.625}Al_{3.375}O_{1.125}N_{14.875}$ dispersed in a resin layer is applied over the LED 2. This device functions as a lighting device in which, upon conduction of currents to an electrically conductive terminal, the LED 2 emits 405-nm light that in turn excites the blue fluorescent material and the yellow fluorescent material to give out blue light and yellow light, so that they are mixed together to emit white light.

In an alternative embodiment of the lighting device, a formulation different from the aforesaid one is designed. First, a 380-nm violet LED is used as a light-emitting element. The fluorescent material of inventive Example 1, a green fluorescent material (β-sialon:Eu) and a red fluorescent material ($CaAlSiN_3$:Eu) dispersed in a resin layer are applied over the violet LED. This device functions as a lighting device in which, upon conduction of currents to an electrically conductive terminal, the LED emits 380-nm light that in turn excites the red, green and blue fluorescent materials, giving out red, green, and blue light, which are then mixed together into white light.

Figure 4:
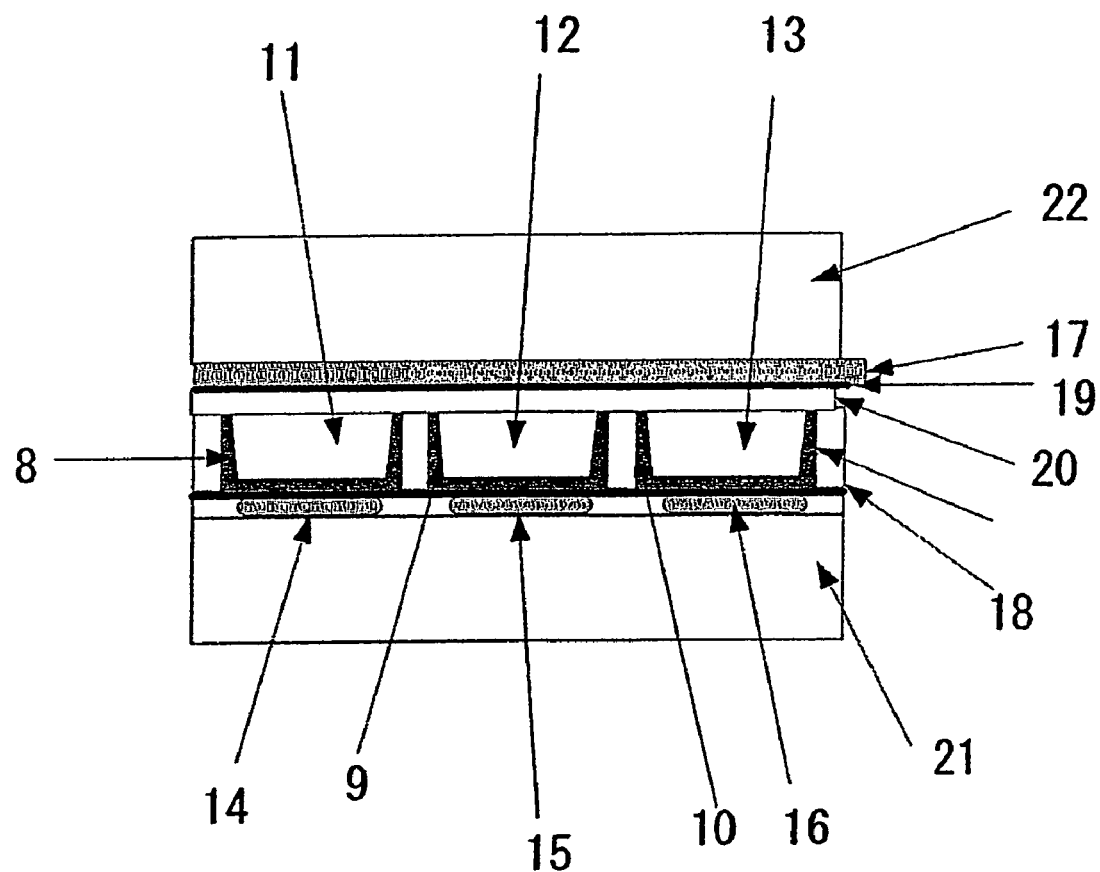
FIG. 4 is illustrative in schematic of one embodiment of the inventive image display (plasma display panel).

One exemplary image display design using the fluorescent material of the invention is now explained. FIG. 4 is illustrative in schematic of the principles of a plasma display panel working as that image display. The blue fluorescent material of inventive Example 1, a green fluorescent material ($Zn_2SiO_4$:Mn) and a red fluorescent material ($CaAlSiN_3$:Eu) are coated on, the inner surfaces of the associated cells 11, 12 and 13, respectively. Conduction of currents to electrodes 14, 15, 16 and 17 causes vacuum ultraviolet radiation to occur by Xe discharge in the cells, whereby the fluorescent materials are excited, generating red, green, and blue visible light to be observed from outside through a protective layer 20, a dielectric layer 19 and a glass substrate 22. This way, the image display works.

The fluorescent material of the invention, because of emitting blue or green light upon irradiation with electron radiation, also functions as a fluorescent material for CRTs or field emission displays.

POSSIBLE APPLICATIONS TO THE INDUSTRY

The present invention provides a novel oxynitride fluorescent material, which is capable of emitting light with higher luminance and is lesser likely to decrease in luminance and deteriorate as compared with conventional sialon, and so lends itself well to VFDs, FEDs, PDPS, CRTs, white LEDs and so on. This fluorescent material will have wide applications to material designs in such fields.

I claim:

1. An oxynitride fluorescent material, which contains as a main component a crystal phase represented by a general formula $La_3Si_8N_{11}O_4$, with an optically active element (M) added thereto as a luminescence center, wherein said optically active element (M) comprises one or more elements selected from Mn, Ce, Pr, Nd, Sm, Eu, Gd, Dy, Ho, Er, Tm, Yb and Lu.

2. An oxynitride fluorescent material, which contains as a main component a crystal phase represented by a general formula $La_3Si_{8-x}Al_xN_{11-x}O_{4+x}$, where $0<x \leq 4$, with an optically active element (M) added thereto as a luminescence center.

3. The oxynitride fluorescent material according to claim 2, wherein said optically active element (M) comprises one or more elements selected from Mn, Ce, Pr, Nd, Sm, Eu, Gd, Tb, Dy, Ho, Er, Tm, Yb and Lu.

4. The oxynitride fluorescent material according to claim 3, wherein x is $0<x \leq 2$.

5. The oxynitride fluorescent material according to claim 1, wherein at least Ce is contained as said optically active element (M).

6. An oxynitride fluorescent material, which comprises an optically active element (M) and elements La, Si, Al, N and O, wherein M is one or more elements selected from Mn, Ce, Pr, Nd, Sm, Eu, Gd, Dy, Ho, Er, Tm, Yb and Lu, has a compositional formula $M_aLa_bSi_cAl_dN_eO_f$ provided that a+b=3, and satisfies all conditions (i) (ii), (iii), (iv) and (v):

$0.00001 \leq a \leq 2.5$ (i)

$4 \leq c \leq 10$ (ii)

$0 \leq d \leq 4$ (iii)

$7 \leq e \leq 14$ (iv)

$2 \leq f \leq 8$ (v).

7. The oxynitride fluorescent material according to claim 6, wherein d=0.

8. The oxynitride fluorescent material according to claim 6, wherein c=8, e=11, and f=4.

9. The oxynitride fluorescent material according to claim 6, wherein Ce is selected as an M component.

10. The oxynitride fluorescent material according to claim 1, which comprises a mixture of a $La_3Si_8N_{11}O_4$ crystal phase with other crystal phase or an amorphous phase, and having a $La_3Si_8N_{11}O_4$ crystal phase content of at least 50% by mass.

11. A lighting device comprising a light emission source and a fluorescent material, wherein the fluorescent material comprises the materials recited in any one of claims 1, 2, and 6.

12. The lighting device according to claim 11, wherein said light emission source is an LED emitting a 330 to 420 nm wavelength light.

13. A lighting device comprising a light emission source and a fluorescent material, wherein said light emission source is a 330 to 420 nm wavelength light emitting LED that is used in combination with the fluorescent material as recited in any one of claims 1, 2, and 6 a green luminescent material that emits light having a wavelength of 520 nm to 570 nm inclusive in response to excitation light of 330 to 420 nm and a red fluorescent material that emits light of 570 nm to 700 nm inclusive in response to excitation light of 330 to 420 nm to mix together red light, green light and blue light, thereby emitting white light.

14. A lighting device comprising a light emission source and a fluorescent material, wherein said light emission source is a 330 to 420 nm wavelength light emitting LED that is used in combination with the fluorescent material as recited in any one of claims 1, 2, and 6 and a yellow fluorescent material that emits light having a wavelength of 550 nm to 600 nm inclusive in response to excitation light of 330 to 420 nm to mix together yellow light and blue light, thereby emitting white light.

15. The lighting device according to claim 13, wherein said green fluorescent material is β-sialon with Eu in a solid solution form.

16. The lighting device according to claim 13, wherein said red fluorescent material is $CaAlSiN_3$ with Eu in a solid solution form.

17. The lighting device according to claim 14, wherein said yellow fluorescent material is Ca-α-sialon with Eu in a solid solution form.

18. An image display device comprising an excitation source and a fluorescent material, wherein the fluorescent material comprises the material recited in any one of claims 1, 2, and 6.

19. The image display device according to claim 18, which is any one of a vacuum fluorescent display tube (VFD), a field emission panel (FED), a plasma display panel (PDP), and a cathode ray tube (CRT).

20. The oxynitride fluorescent material according to claim 2, which comprises a mixture of a $La_3Si_{8-x}Al_xN_{11-x}O_{4+x}$ crystal phase where $0<x\leqq4$ with other crystal phase or an amorphous phase, and having a $La_3Si_{8-x}Al_xN_{11-x}O_{4+x}$ crystal phase content of at least 50% by mass.

* * * * *